US009953900B2

(12) United States Patent
Safran et al.

(10) Patent No.: US 9,953,900 B2
(45) Date of Patent: Apr. 24, 2018

(54) TRANSISTOR STRUCTURES GATED USING A CONDUCTOR-FILLED VIA OR TRENCH

(71) Applicant: GLOBALFOUNDRIES INC., Grand Cayman (KY)

(72) Inventors: John M. Safran, Wappingers Falls, NY (US); Sami Rosenblatt, White Plains, NY (US); Michael S. Cranmer, Poughkeepsie, NY (US); Chandrasekharan Kothandaraman, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/083,914

(22) Filed: Mar. 29, 2016

(65) Prior Publication Data

US 2017/0287812 A1    Oct. 5, 2017

(51) Int. Cl.
| | |
|---|---|
| *H01L 21/326* | (2006.01) |
| *H01L 23/48* | (2006.01) |
| *H01L 21/768* | (2006.01) |
| *H01L 21/66* | (2006.01) |

(52) U.S. Cl.
CPC .......... *H01L 23/481* (2013.01); *H01L 21/326* (2013.01); *H01L 21/76898* (2013.01); *H01L 22/14* (2013.01); *H01L 22/32* (2013.01)

(58) Field of Classification Search
CPC ..... H01L 23/48; H01L 21/768; H01L 21/326; H01L 21/66
See application file for complete search history.

(56) References Cited

U.S. PATENT DOCUMENTS

| 8,492,903 B2 | 7/2013 | Bartley et al. |
| 8,823,090 B2 | 9/2014 | Bartley et al. |
| 8,907,410 B2 | 12/2014 | Kothandaraman et al. |
| 2011/0068398 A1* | 3/2011 | Anderson ........... H01L 21/2255 257/347 |
| 2012/0146711 A1* | 6/2012 | Bartley ........... H01L 21/823431 327/530 |
| 2012/0211829 A1* | 8/2012 | Bartley ............... H01L 25/0657 257/332 |
| 2014/0118059 A1* | 5/2014 | Kim .................. H01L 21/76898 327/535 |
| 2014/0319600 A1* | 10/2014 | Kothandaraman ....................... H01L 21/823437 257/330 |

* cited by examiner

*Primary Examiner* — Asok K Sarkar
*Assistant Examiner* — Dmitriy Yemelyanov
(74) *Attorney, Agent, or Firm* — Thompson Hine LLP; Anthony Canale

(57) ABSTRACT

Device structures involving a conductor-filled via or trench, methods of forming such device structures, and methods of operating such device structures. A doped region is formed in the substrate. An opening, such as a via or trench, is formed that extends through the doped region and into a portion of the substrate beneath the doped region. A conductive plug in formed in the opening to provide the conductor-filled via or trench. The opening is positioned and dimensioned relative to a position and dimensions of the doped region to divide the doped region into a first section and a second section that is disconnected from the first section by the opening.

15 Claims, 4 Drawing Sheets

US 9,953,900 B2

TRANSISTOR STRUCTURES GATED USING A CONDUCTOR-FILLED VIA OR TRENCH

BACKGROUND

The invention relates generally to integrated circuits and, in particular, to device structures involving a conductor-filled via or trench and methods of forming such device structures.

Through-silicon vias are short, vertical electrical connections that pass through a wafer to establish an electrical connection from the active device side to the backside of a die. Through-silicon vias improve spatial efficiencies and interconnect densities in comparison with wire bonding and flip chip stacking. A through-silicon via is fabricated by etching a via into the wafer and filling the resulting via with a conductor. The silicon wafer is thinned from its backside until the conductor fill is exposed, and backside metal is applied on the thinned backside surface to establish electrical contact. Through-silicon vias are an enabling technology for three-dimensional (3D) vertical integration for stacking die with a reduced form factor.

Device structures involving a conductor-filled via or trench and methods of forming such device structures are needed.

SUMMARY

In an embodiment of the invention, a device structure is formed using a substrate. The device structure includes a doped region in the substrate, as well as a dielectric layer inside an opening in the substrate that extends through the doped region and into a portion of the substrate beneath the doped region and a conductive plug inside the opening. The opening is positioned and dimensioned relative to a position and dimensions of the doped region to divide the doped region into a first section and a second section that is disconnected from the first section by the opening.

In an embodiment of the invention, a method is provided for forming a device structure using a substrate. A doped region is formed in the substrate. An opening is formed that extends through the doped region and into a portion of the substrate beneath the doped region, a dielectric layer is formed on the substrate inside the opening, and a conductive plug is formed inside the opening. The dielectric layer located inside the opening between the conductive plug and the substrate. The opening is positioned and dimensioned relative to a position and dimensions of the doped region to divide the doped region into a first section and a second section that is disconnected from the first section by the opening.

In an embodiment of the invention, a method includes applying a gate voltage to a conductive plug located in an opening that extends through a doped region in the substrate and into a portion of the substrate beneath the doped region. A current of charge carriers is directed through an inversion layer formed in the substrate due to the gate voltage applied to the conductive plug and extending around the conductive plug from a first section of the doped region to a second section of the doped region that is disconnected from the first section of the doped region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
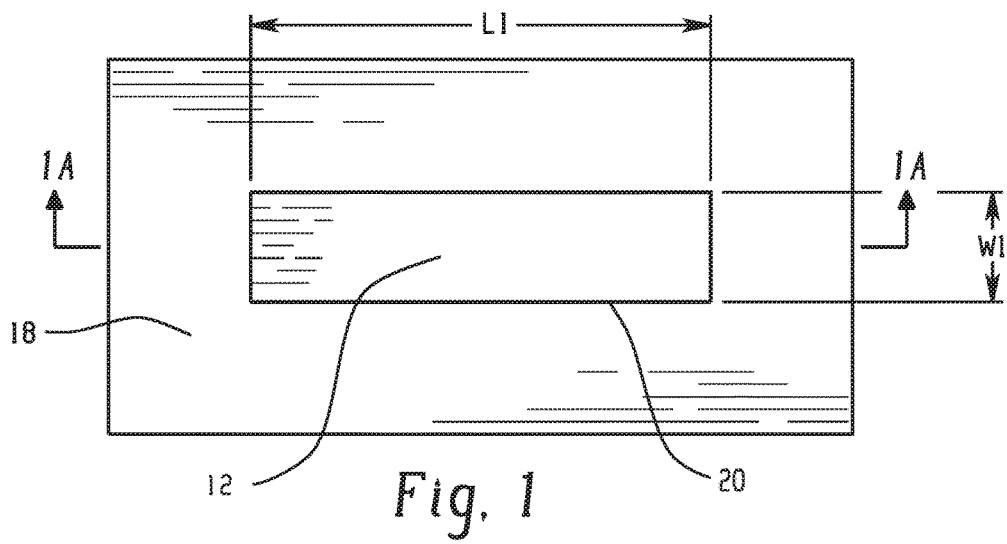
FIG. 1 is a top view of a portion of a substrate at an initial stage of a fabrication process forming a device structure in accordance with an embodiment of the invention
Figure 1A:
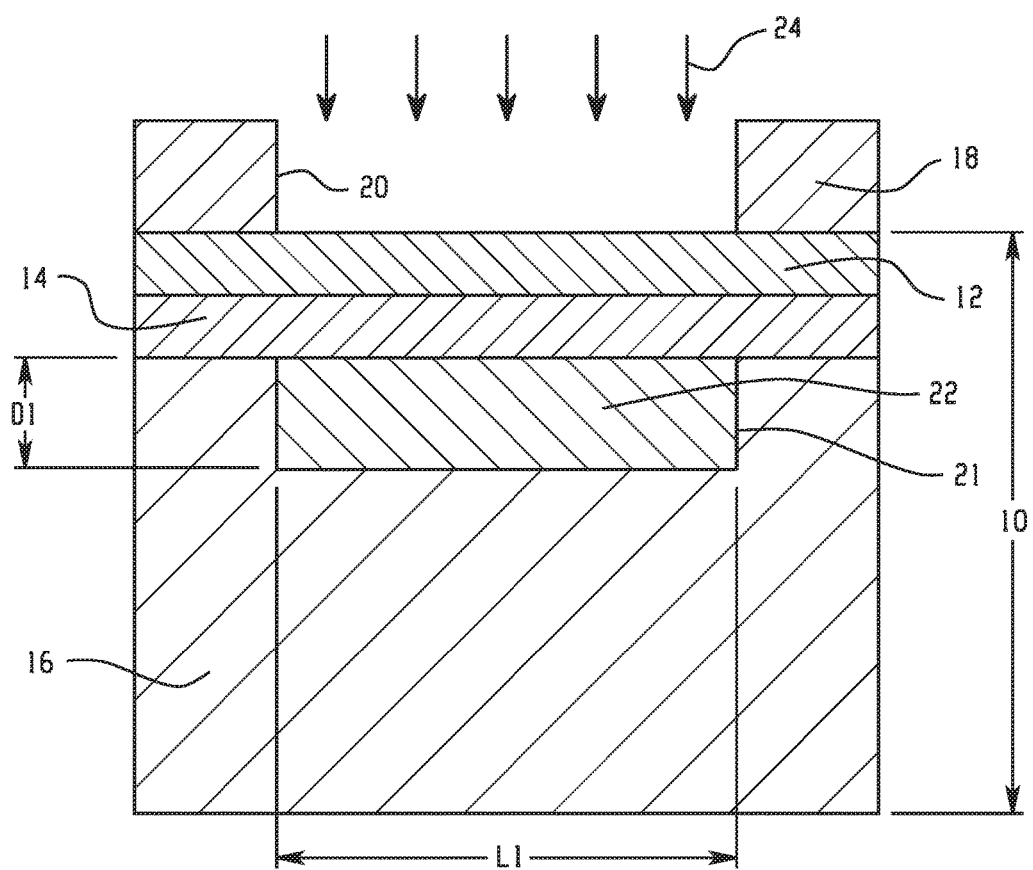
FIG. 1A is a cross-sectional view taken generally along line 1A-1A in FIG. 1.

With reference to FIGS. 1, 1A and in accordance with an embodiment of the invention, a substrate 10 in the representative form of a semiconductor-on-insulator (SOI) substrate includes a device layer 12, a buried dielectric layer in the form of a buried oxide (BOX) layer 14 comprised of an oxide of silicon (e.g., $SiO_2$), and a handle wafer 16. The device layer 12 is separated from the handle wafer 16 by the intervening BOX layer 14 and is considerably thinner than the handle wafer 16. The device layer 12 and the handle wafer 16 may be comprised of a single crystal semiconductor material, such as silicon. The BOX layer 14 has a surface in direct contact with the handle wafer 16 along an interface and another surface in direct contact with the device layer 12 along another interface, and these surfaces are separated by the thickness of the BOX layer 14 that terminates at the rim of the substrate 10. The device layer 12 is electrically isolated from the handle wafer 16 by the BOX layer 14. The handle wafer 16 may be lightly doped to have, for example, p-type conductivity. The front side of the substrate 10 including the device layer 12 may be considered to be an active device side of the substrate 10.

An implantation mask 18 is disposed on a top surface of the device layer 12. The implantation mask 18 may comprise a photoresist that is applied as a coating by a spin coating process, pre-baked, exposed to light projected through a photomask, baked after exposure, and developed with a chemical developer to form an opening 20 of a given area at which a doped region is subsequently formed by ion implantation.

A doped region 22 is formed in the semiconductor material of the handle wafer 16 at the location of the opening 20 in the implantation mask 18. The doped region 22 may be formed by implanting energetic ions, which are indicated diagrammatically by singled-headed arrows 24, with selected implantation conditions (e.g., ion species, dose, kinetic energy, angle of incidence) to deliver the ions 24 at the location of the opening 20 through the device layer 12 and BOX layer 14 into the underlying handle wafer 16 to provide a concentration profile across a chosen depth range.

The ions 24 are stopped in the implantation mask 18 across regions surrounding the opening 20.

The ions 24 may be generated from a suitable source gas and implanted using an ion implantation tool. The ions 24 are selected to impart a conductivity type to the doped region 22 that is opposite from the conductivity type of the handle wafer 16, which may provide an ohmic contact to an inverted channel formed during device operation about a subsequently-formed TSV. In an embodiment in which the semiconductor material of the handle wafer 16 has p-type conductivity, the ions 24 may comprise an ion species that delivers a dopant from Group V of the Periodic Table (e.g., phosphorus (P), arsenic (As), or antimony (Sb)) in a concentration that is effective to impart n-type conductivity to the semiconductor material of the handle wafer 16. In another embodiment in which the semiconductor material of the handle wafer 16 has p-type conductivity, the ions 24 may comprise an ion species that delivers a dopant from Group III of the Periodic Table (e.g., boron) in a concentration that is effective to impart p-type conductivity to the semiconductor material of the handle wafer 16. When the dopant is electrically activated, the doped region 22 may have a reduced electrical resistance in comparison with the handle wafer 16 surrounding its volume, as well as an opposite conductivity type.

The doped region 22 is located in the handle wafer 16 proximate to the interface between the BOX layer 14 and the handle wafer 16. The doped region 22 in the handle wafer 16 may be a multi-sided volume having a three-dimensional boundary 21 with the surrounding un-implanted semiconductor material of the handle wafer 16. In an embodiment, the doped region 22 may be a rectangular cuboid that is rectangular in cross-sectional area and thereby characterized in cross-section as a strip having linear dimensions defined by a length, L1, and a width, W1, at the boundary 21. In a direction normal to a plane containing the length and width, the doped region 22 has a linear dimension defined by a height, D1, that is related to the depth range of the concentration profile for the implanted dopant introduced by ions 24. In alternative embodiments, the doped region 22 may have a different multi-sided geometrical shape that is characteristic of a polyhedron.

Figure 2:
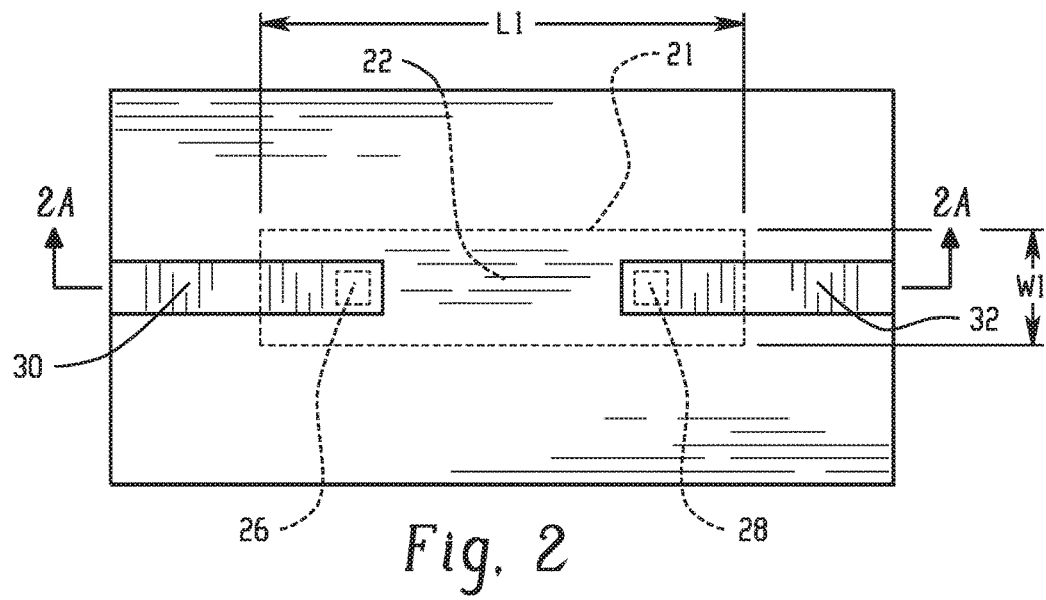
FIG. 2 is a top view of the substrate portion at a stage of the fabrication process for the device structure that is subsequent to FIG. 1.
Figure 2A:
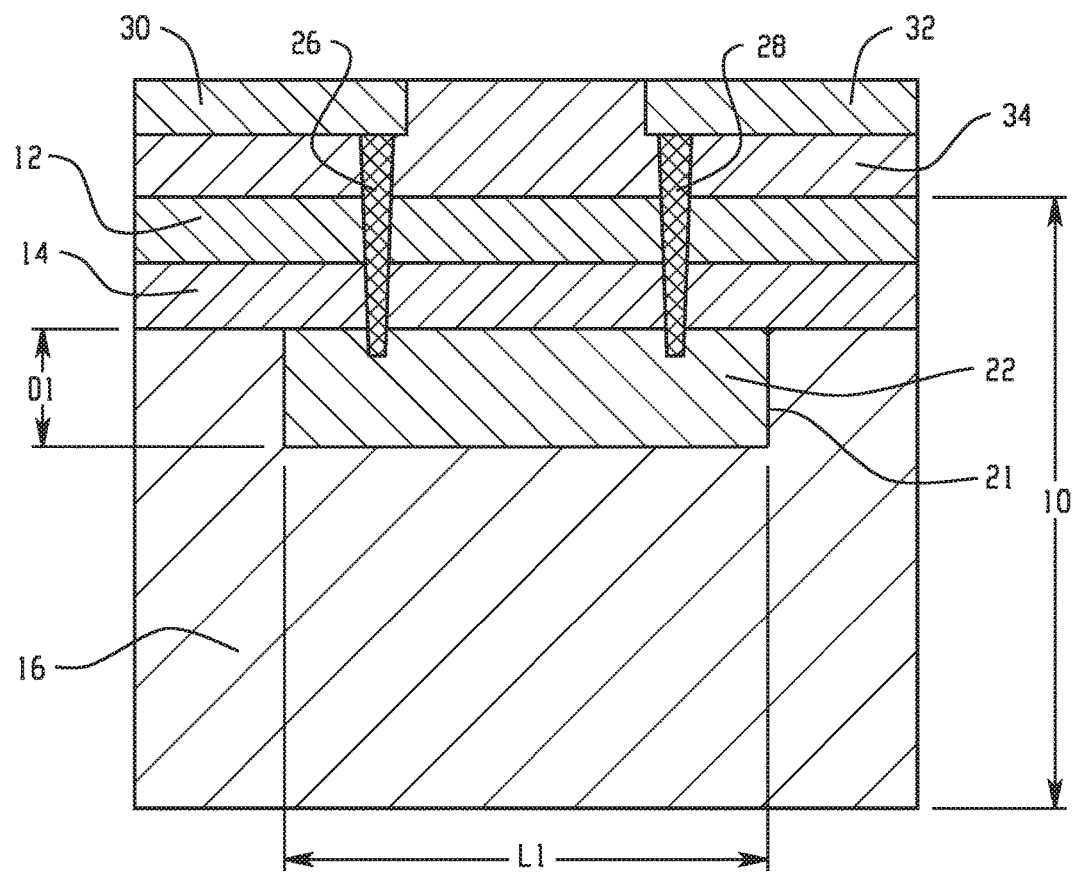
FIG. 2A is a cross-sectional view taken generally along line 2A-2A in FIG. 2.

With reference to FIGS. 2, 2A in which like reference numerals refer to like features in FIGS. 1, 1A and at a subsequent fabrication stage, contacts 26, 28 of a local interconnect level are formed in respective contact holes that extend through the device layer 12 and BOX layer 14 to the doped region 22 in the handle wafer 16. Wiring 30, 32 is coupled by the contacts 26 with the doped region 22. The wiring 30, 32 and the section of the contacts 26, 28 above the device layer 12 are formed in a dielectric layer 34. The wiring level including the wiring 30, 32 may represent the first wiring level that is closest to the device layer 12 in the stacked arrangement.

The contacts 26, 28 and wiring 30, 32 may be formed during middle-of-line (MOL) processing. Dielectric layer 34 may be comprised of an electrically-insulating material, such as silicon dioxide deposited by chemical vapor deposition. Contacts 26, 28 may be comprised of an electrically-conductive material, such as tungsten, deposited in the vias, which are defined by photolithography and etching processes and aligned with, in this instance, the doped region 22. An etch mask (not shown) is applied to a top surface of the device layer 12, and may comprise a photoresist applied as a coating by a spin coating process, pre-baked, exposed to light projected through a photomask, baked after exposure, and developed with a chemical developer to form contact holes. Through selection of the location of the contact holes, one of the contacts 26 intersects the implanted region near one end and the other of the contacts 28 intersects the doped region 22 near its opposite end such the contacts 26, 28 are spaced apart. The contacts 26, 28 may penetrate for a given distance into the doped region 22. In the representative embodiment, the contacts 26, 28 do not penetrate completely through the height dimension of the doped region 22 in the depth dimension parallel to the long axis of the contacts 26, 28.

Figure 3:
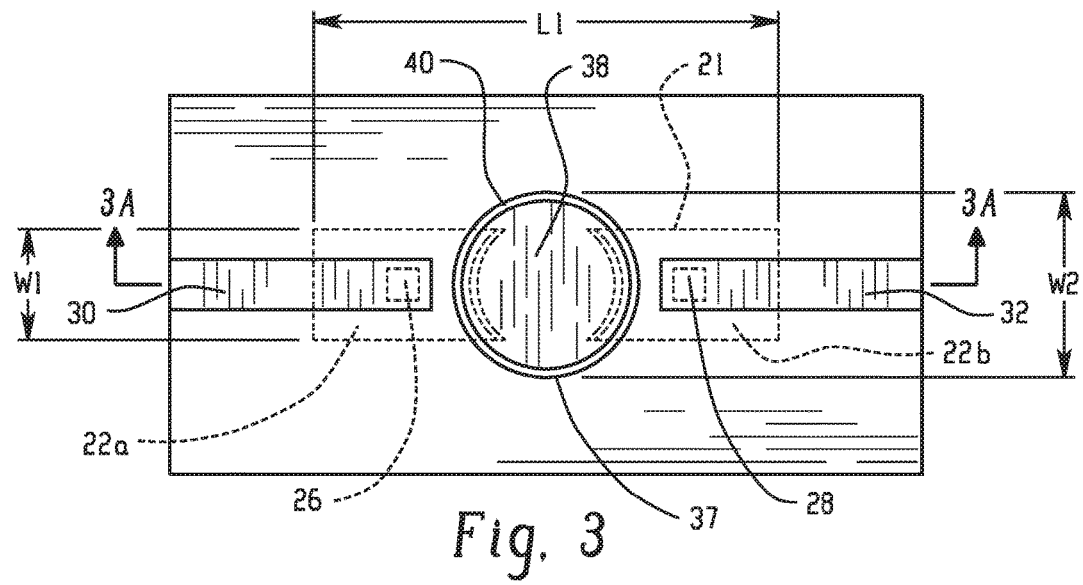
FIG. 3 is a top view of a portion of a substrate at a stage of the fabrication process for the device structure that is subsequent to FIG. 2.
Figure 3A:
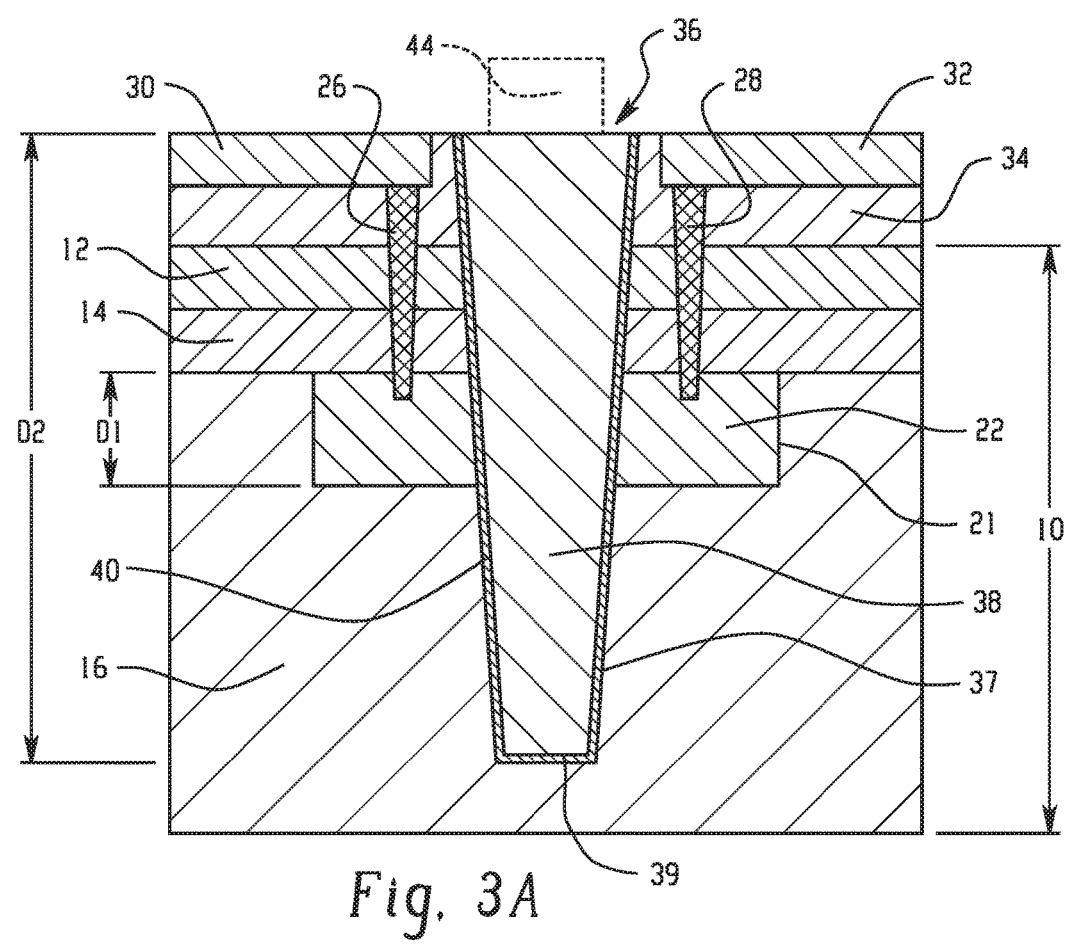
FIG. 3A is a cross-sectional view taken generally along line 3A-3A in FIG. 3.

With reference to FIGS. 3, 3A in which like reference numerals refer to like features in FIGS. 2, 2A and at a subsequent fabrication stage, a through-silicon via (TSV) 36 is formed that extends in an opening 37 having the form of a via through the dielectric layer 34 of the local interconnect level, the device layer 12, the BOX layer 14, and the doped region 22 into the non-implanted portion of the handle wafer 16 underlying the doped region 22. The TSV 36 includes a conductive plug 38 and a dielectric layer 40 that is located inside the opening 37 between the conductive plug 38 and the semiconductor material of the handle wafer 16 surrounding the conductive plug 38. The conductive plug 38 and dielectric layer 40 fill the open volume and conform to the shape of the opening 37. The dielectric layer 40 electrically insulates the conductive plug 38 from the semiconductor material of the handle wafer 16 surrounding the conductive plug 38.

The opening 37 containing the TSV 36 is positioned and sized to interrupt the continuity of the doped region 22. Specifically, the opening 37 is aligned to extend through the doped region 22 between contact 26 and contact 28 into a portion of the handle wafer 16 beneath the doped region 22 (i.e., the doped region 22 is positioned vertically between the portion of the handle wafer 16 and the BOX layer 14), and the dimensions of the opening 37 relative to the dimensions of the doped region 22 are selected such that the doped region 22 is divided into two distinct and disconnected sections 22a, 22b. The opening 37 penetrates completely through the height dimension of the doped region 22 parallel to the long axis of the opening 37 and conductive plug 38 and, over the height dimension, a dimension W2 of the opening 37 in the plane of the length and width of the doped region 22 is large enough to extend through the boundary 21 of the doped region 22 in its shortest dimension, such as the width dimension. For example, if the opening 37 and conductive plug 38 are round in cross-section, the diameter dimension of the opening 37 over its entire height may be greater than the width dimension of the doped region 22. The cross-sectional areas of the opening 37 and the doped region 22 are related such that the opening 37 does not disturb the contacts 26, 28, much less extend through the boundary 21 of the doped region 22 in its longest dimension, such as the length dimension in the representative embodiment.

The TSV 36 may be fabricated by deep reactive ion etching (e.g., a Bosch process) in the presence of an etch mask to form the opening 37, electrically insulating the via with the dielectric layer 40, lining the opening 37 with a conductive liner that may function as a diffusion barrier, and filling the via with the conductive plug 38. The dielectric layer 40 may comprise silicon nitride or an oxide of silicon deposited by, for example, plasma-enhanced chemical vapor deposition. The conductive plug 38 may be comprised of copper deposited by, for example, depositing a copper seed layer by physical vapor deposition or chemical vapor deposition inside the via and plating copper with an electrochemical process such as electroplating. In the representative embodiment, conductive plug 38 is round in cross-section, is solid, and is slightly tapered with increasing depth so that the diameter decreases with increasing depth. Alternatively, the cross-sectional area may be constant over the height of the conductive plug 38. Although the conductive plug 38 is shown coplanar with the dielectric layer 34 and wiring 30, 32, additional dielectric layers may be formed on dielectric layer 34 and the conductive plug 38 may project above a plane containing top surfaces of the wiring 30, 32 and dielectric layer 34.

Another wiring layer may be applied by back-end-of-line (BEOL) processing that includes a capture pad 44 that is coupled with the TSV 36. The capture pad 44 may be formed in a dielectric layer 46 (e.g., silicon dioxide) and may be comprised of a metal (e.g., copper). Voltage may be applied to the capture pad 44 in order to bias the TSV 36 with a gate voltage during operation. The capture pad 44 coupled with the conductive plug 38 and the wiring 30, 32 coupled by the contacts 26, 28 with the sections 22a, 22b of the doped region 22 are located on the active device side of the substrate 10. Additional wiring layers (not shown) may be formed over the wiring layer including the capture pad 44. Alternatively, the capture pad 44 may be formed in one of these upper wiring levels and connected with the conductive plug 38 of the TSV 36 by vertical metallization in the lower wiring levels. The capture pad 44 may be smaller in dimensions than the diameter or width of the conductive plug 38 of the TSV 36 as depicted in FIG. 3A or, alternatively, may be larger in dimensions than the diameter or width of the conductive plug 38 of the TSV 36.

It should also be understood that, while a TSV is usually referred to as a "through-silicon" via because it may extend through a substrate comprising silicon, a TSV in fact may extend through materials that do not include silicon. Even in this latter case, a TSV may still be referred to by a person skilled in the art as a "through-silicon via" even though it may extend through materials other than silicon. Alternatively, it may be referred to as a "through-semiconductor via", a "through-substrate via", or more simply a "through via".

A tip 39 of the TSV 36 may be subsequently exposed as part of a via reveal process. To that end, the handle wafer 16 may be thinned from its back side (i.e., non-device side) by grinding and/or wet or dry etching to reduce its original thickness and thereby expose the tip 39 of the TSV 36. Once thinned, the tip of the TSV 36 may project from the back side surface. The TSV 36 may provide a continuous conductive path between opposite sides of the thinned substrate 10 for signals, power, and/or ground.

The device structure in accordance with the embodiments of the invention overcomes limitations that prevent conventional FEOL devices from being located near a TSV due to the potential for adverse interaction with the FEOL devices during the process forming the TSV. The device structure can be used for various end uses, such as characterizing the TSV formation process by assessing the state of the surrounding substrate following the reveal process, enabling transistor function on interposers lacking integrated regular FEOL transistors, and other applications, such as a strain detector, a resistor, or a photo-detector. In these end uses, the device structure is operated in the same manner as a field-effect transistor. The device structure may be used, for example, to establish ohmic contact to handle wafer 16 if the conductivity type of the doped region 22 is modified through a change in the implanted dopant to have the same as the conductivity type of the handle wafer 16.

In use for characterizing the TSV formation process, for example, the state of the handle wafer 16 surrounding the TSV 36 can be assessed by forcing inversion with a gate voltage to the conductive plug 38 and passing a current around the circumference of the TSV 36 between the sections 22a, 22b of the doped region 22 that are operating as a source and a drain of the device structure. Given that the shortest current path between the sections 22a, 22b is around the circumference of the TSV 36, current does not flow around the tip 39 of the conductive plug 38. By controlling the voltage applied to the conductive plug 38 of the TSV 36 in a manner similar to the application of a voltage to the gate of a field effect transistor, a channel in the handle wafer 16 surrounding the TSV 36 can be inverted and current can flow about the TSV from section 22a of doped region 22 to section 22b of doped region 22. All current flows around the TSV 36 near the location of the sections 22a, 22b of doped region 22, and does not flow vertically about the tip of the TSV 36. In this manner, the state of the semiconductor material surrounding the TSV 36 can be detected and abnormalities impacting yield identified. For example, the variability of the TSV electrical properties due to etch process can be assessed.

In an alternative embodiment, the substrate 10 may be a bulk semiconductor substrate, such as a bulk silicon wafer. The principles of the embodiments of the invention apply equally for fabricating the device structure in a bulk substrate.

Figure 4:
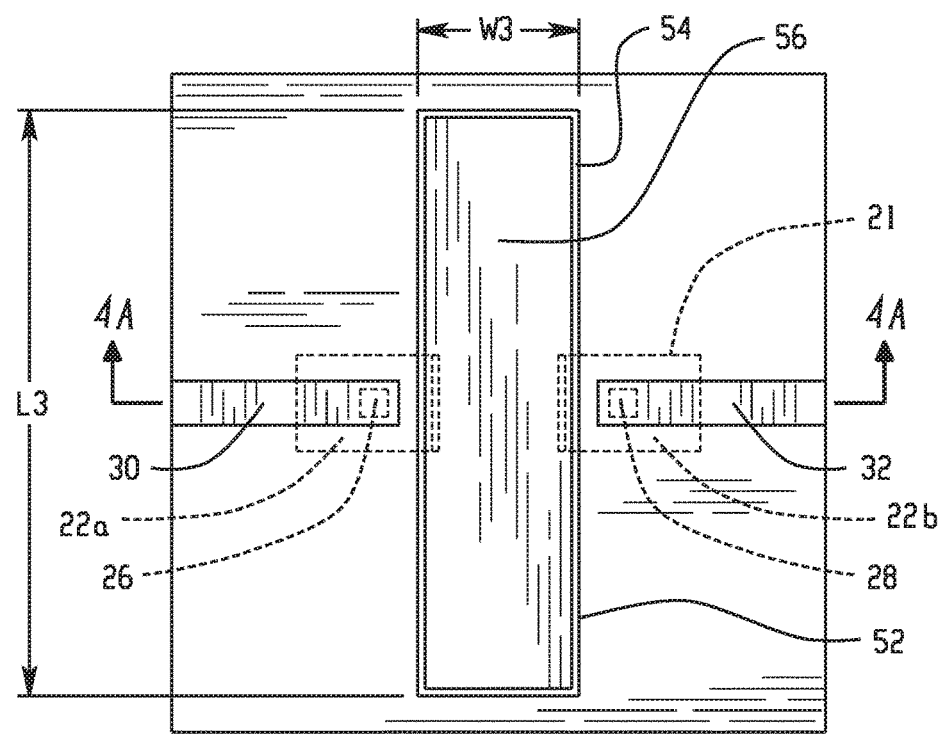
FIG. 4 is a top view similar to FIG. 3 of a portion of a substrate at a stage of a fabrication process forming a device structure in accordance with an alternative embodiment of the invention.
Figure 4A:
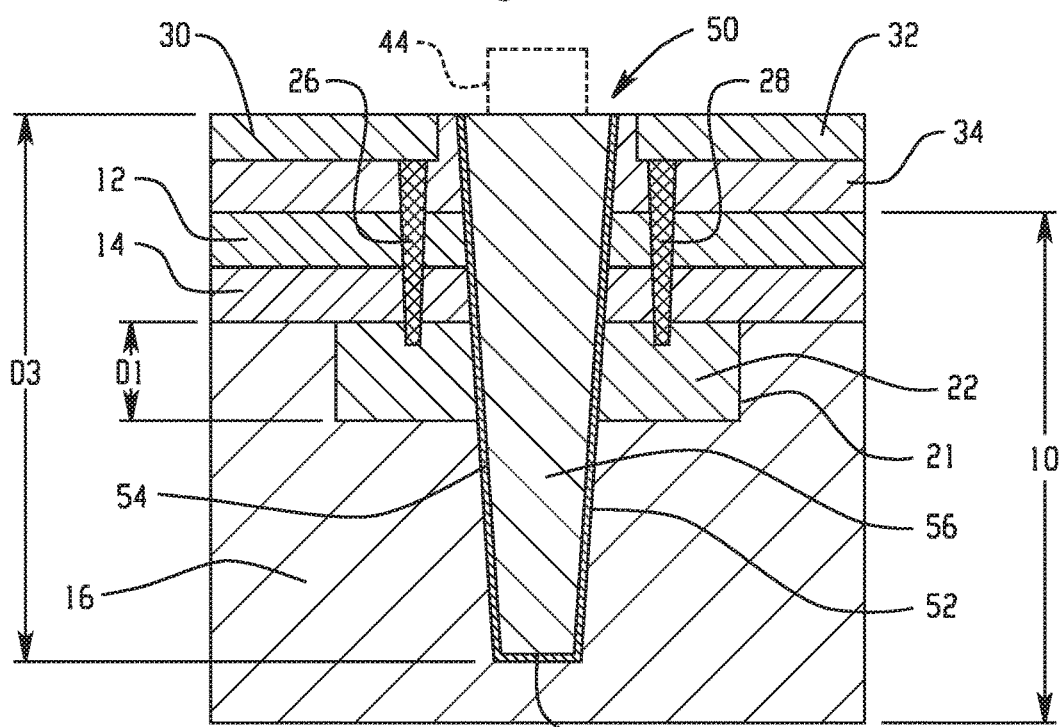
FIG. 4A is a cross-sectional view taken generally along line 4A-4A in FIG. 4.

With reference to FIGS. 4, 4A in which like reference numerals refer to like features in FIGS. 3, 3A and in accordance with an alternative embodiment of the invention, the TSV 36 may be replaced by a structure 50 having a different geometrical shape. For example, the structure 50 may be formed in an opening 52 having the form of a deep trench, instead of a via, and may include a conductive plug 56 similar to conductive plug 38 and a dielectric layer 54 that is similar to dielectric layer 40. Similar to the opening 37 and conductive plug 38, the opening 52 and the conductive plug 56 extend through the doped region 22 and into a portion of the handle wafer 16 beneath the doped region 22. The structure 50 may be formed in a manner similar to the formation of the TSV 36 by adjusting the etch mask to form a deep trench instead of a deep via. The aspect ratio of the opening 52 may provide the structure 50 with a long channel that can handle a current with a high current density.

The opening 52 has linear dimensions given by a length L3, a width W3, and a depth D3, and the conductive plug 56 conforms to the shape of the opening 52. The width of the opening 52 is less than the length of the doped region 22 and the length of the opening 52 is greater than the width of the doped region 22. In an embodiment, the length of the opening 52 may be greater than or equal to the depth of the opening 52 in order to force a significant amount of current to flow around the bottom of the opening 52 during operation. The opening 52 should not span the thickness of the substrate 10 in order to promote a flow of current through the semiconductor material of the handle wafer 16 about the bottom of the opening 52 and the conductive plug 56 in opening 52 in a current path from one of the sections 22a, 22b of doped region 22 to the other. This embodiment may be used to assess the impact of the opening 52 at a large depth in the handle wafer 16 relative to the BOX layer 14.

In an embodiment, the length of the opening 52 may be less than or equal to the depth of the opening 52 in order to force a significant amount of current, during operation when gated by a voltage applied to the conductive plug 56, to flow in the handle wafer 16 around the length of the opening 52, instead of the bottom of the opening 52, from one of the sections 22a, 22b of doped region 22 to the other of the sections 22a, 22b of doped region 22. This embodiment is similar to the embodiment involving the TSV 36 in that current is prevented from flowing around the bottom of the conductive plug 56, and may be used to assess the impact of the opening 52 at a shallow depth in the handle wafer 16 relative to the BOX layer 14. The larger current path provided by the opening 52, in comparison with the via in which the TSV 36 is located, provides substrate resistance to current flow over a much longer distance, therefore increasing the sensitivity of device-to-trench proximity. The opening 52 may still be used even it does not span the thickness of the substrate 10 as long as its length is smaller or significantly smaller than its depth.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure formed using a substrate, the device structure comprising:
    a doped region in the substrate;
    an opening in the substrate that extends through the doped region and into a portion of the substrate beneath the doped region;
    a dielectric layer inside the opening; and
    a conductive plug inside the opening,
    wherein the conductive plug is solid, the doped region has an opposite conductivity type from the portion of the substrate, the dielectric layer is located in the opening between the conductive plug and the substrate, the doped region includes a boundary having a first height, a width in a plane normal to the first height, and a length in the plane, the width of the doped region is shorter than the length of the doped region, the opening has a second height that is greater than the first height, and the opening includes a diameter in the plane that is greater than the width of the doped region and is arranged in the plane relative to the doped region to divide the doped region into a first section and a second section that is disconnected from the first section by the opening.

2. The device structure of claim 1 wherein the opening and the conductive plug are round in cross-sectional area in the plane.

3. The device structure of claim 1 wherein the substrate includes a device layer, a handle wafer, and a buried oxide layer between the handle wafer and the device layer, the doped region is located in the handle wafer, and the opening and the conductive plug extend through the device layer and the buried oxide layer into the handle wafer and through the doped region into the handle wafer beneath the doped region.

4. The device structure of claim 3 further comprising:
    a contact extending through the device layer and the handle wafer to the first section of the doped region in the handle wafer; and
    a wire in a wiring layer on the device layer, the wire coupled by the contact with the first section of the doped region in the handle wafer.

5. The device structure of claim 1 further comprising:
    a capture pad coupled with the conductive plug.

6. The device structure of claim 3 wherein the portion of the substrate is a portion of the handle wafer, and the doped region is positioned vertically between the portion of the handle wafer and the buried oxide layer.

7. A method of forming a device structure using a substrate, the method comprising:
    forming a doped region in the substrate;
    forming an opening in the substrate that extends through the doped region and into a portion of the substrate beneath the doped region;
    forming a dielectric layer on the substrate inside the opening; and
    forming a conductive plug inside the opening,
    wherein the conductive plug is solid, the doped region has an opposite conductivity type from the portion of the substrate, the dielectric layer is located in the opening between the conductive plug and the substrate, the doped region includes a boundary having a first height, a width in a plane normal to the first height, and a length in the plane, the width of the doped region is shorter than the length of the doped region, the opening has a second height that is greater than the first height, and the opening includes a diameter in the plane that is greater than the width of the doped region and is arranged in the plane relative to the doped region to divide the doped region into a first section and a second section that is disconnected from the first section by the opening.

8. The method of claim 7 wherein the substrate includes a device layer, a handle wafer, and a buried oxide layer between the handle wafer and the device layer, and forming the doped region in the substrate comprises:
    implanting ions through the device layer and the buried oxide layer into the handle wafer,
    wherein the ions are selected such that the doped region has the opposite conductivity type from the handle wafer.

9. The method of claim 7 wherein the opening and the conductive plug are round in cross-sectional area in the plane.

10. The method of claim 7 wherein the substrate includes a device layer, a handle wafer, and a buried oxide layer between the handle wafer and the device layer, the doped region is located in the handle wafer, and the opening and the conductive plug extend through the device layer and the buried oxide layer into the handle wafer and through the doped region into the handle wafer beneath the doped region.

11. The method of claim 10 further comprising:
forming a contact extending through the device layer and the handle wafer to the first section of the doped region in the handle wafer; and
forming a wire in a wiring layer on the device layer,
wherein the wire is coupled by the contact with the first section of the doped region in the handle wafer.

12. The method of claim 7 further comprising:
forming a capture pad that is coupled with the conductive plug.

13. The device structure of claim 1 wherein the conductive plug is a gate of a transistor, the first section of the doped region is a source of the transistor, the second section of the doped region is a drain of the transistor, and a channel is arranged in the substrate surrounding the opening between the source and the drain.

14. The method of claim 7 wherein the conductive plug is a gate of a transistor, the first section of the doped region is a source of the transistor, the second section of the doped region is a drain of the transistor, and a channel is arranged in the substrate surrounding the opening between the source and the drain.

15. The method of claim 10 wherein the portion of the substrate is a portion of the handle wafer, and the doped region is positioned vertically between the portion of the handle wafer and the buried oxide layer.

* * * * *